US010217673B2

(12) United States Patent
Dasgupta et al.

(10) Patent No.: US 10,217,673 B2
(45) Date of Patent: Feb. 26, 2019

(54) INTEGRATED CIRCUIT DIE HAVING REDUCED DEFECT GROUP III-NITRIDE STRUCTURES AND METHODS ASSOCIATED THEREWITH

(71) Applicant: Intel Corporation, Santa Clara, CA (US)

(72) Inventors: Sansaptak Dasgupta, Hillsboro, OR (US); Han Wui Then, Portland, OR (US); Marko Radosavljevic, Beaverton, OR (US); Sanaz K. Gardner, Hillsboro, OR (US); Seung Hoon Sung, Portland, OR (US); Robert S. Chau, Beaverton, OR (US); Ravi Pillarisetty, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 103 days.

(21) Appl. No.: 15/528,031

(22) PCT Filed: Dec. 17, 2014

(86) PCT No.: PCT/US2014/070950
§ 371 (c)(1),
(2) Date: May 18, 2017

(87) PCT Pub. No.: WO2016/099491
PCT Pub. Date: Jun. 23, 2016

(65) Prior Publication Data
US 2018/0315659 A1 Nov. 1, 2018

(51) Int. Cl.
*H01L 29/20* (2006.01)
*H01L 21/8252* (2006.01)
(Continued)

(52) U.S. Cl.
CPC ........ *H01L 21/8252* (2013.01); *H01L 33/007* (2013.01); *H01L 33/08* (2013.01);
(Continued)

(58) Field of Classification Search
CPC .......... H01L 21/8252; H01L 21/02458; H01L 21/0254; H01L 21/0262; H01L 21/02647;
(Continued)

(56) References Cited

U.S. PATENT DOCUMENTS 8,148,252 B1 * 4/2012 Figuet ................. C30B 25/02
257/E21.097
8,324,660 B2 * 12/2012 Lochtefeld ........ H01L 21/02381
257/190
(Continued)

FOREIGN PATENT DOCUMENTS

EP      2 343 731 A2    7/2011
WO   WO 2006/099211 A1   9/2006
WO   WO 2013/121289 A2   8/2013

OTHER PUBLICATIONS

International Preliminary Report on Patentability dated Aug. 29, 2017, issued in corresponding International Application No. PCT/US2014/070950, 14 pages.
(Continued)

*Primary Examiner* — Long K Tran
(74) *Attorney, Agent, or Firm* — Schwabe, Williamson & Wyatt, P.C.

(57) ABSTRACT

Embodiments of the present disclosure are directed toward an integrated circuit (IC) die. In embodiments, an IC die may include a semiconductor substrate and a buffer layer disposed over the semiconductor substrate. The buffer layer may have a plurality of openings formed therein. In embodiments, the IC die may further include a plurality of group III-Nitride structures. Individual group III-Nitride structures
(Continued)

of the plurality of group III-Nitride structures may include a lower portion disposed in a respective opening of the plurality of openings and an upper portion disposed over the respective opening. In embodiments, the upper portion may include a base extending radially from sidewalls of the respective opening over a surface of the buffer layer to form a perimeter around the respective opening. Other embodiments may be described and/or claimed.

25 Claims, 11 Drawing Sheets

(51) Int. Cl.
| | | |
|---|---|---|
| *H01L 33/00* | (2010.01) | |
| *H01L 33/08* | (2010.01) | |
| *H01L 33/12* | (2010.01) | |
| *H01L 33/32* | (2010.01) | |
| *H01L 33/24* | (2010.01) | |
| *H01L 21/02* | (2006.01) | |

(52) U.S. Cl.
CPC .............. *H01L 33/12* (2013.01); *H01L 33/24* (2013.01); *H01L 33/32* (2013.01); *H01L 21/0254* (2013.01); *H01L 21/0262* (2013.01); *H01L 21/02458* (2013.01); *H01L 21/02647* (2013.01)

(58) Field of Classification Search
CPC ....... H01L 33/007; H01L 33/08; H01L 33/12; H01L 133/24; H01L 33/32
USPC .......................................................... 257/76
See application file for complete search history.

(56) References Cited

U.S. PATENT DOCUMENTS

| | | | |
|---|---|---|---|
| 9,048,303 B1* | 6/2015 | Ostermaier | ......... H01L 29/7783 |
| 2003/0168666 A1 | 9/2003 | Okuyama et al. | |
| 2008/0012030 A1 | 1/2008 | Yoon et al. | |
| 2010/0176375 A1* | 7/2010 | Lochtefeld | ........ H01L 21/02381 257/14 |
| 2010/0295084 A1 | 11/2010 | Tu et al. | |
| 2011/0049568 A1* | 3/2011 | Lochtefeld | ........ H01L 21/02381 257/190 |
| 2013/0087191 A1 | 4/2013 | Tan et al. | |
| 2013/0175501 A1 | 7/2013 | Hersee et al. | |
| 2014/0131722 A1* | 5/2014 | Bayram | ................... H01L 29/04 257/76 |
| 2014/0131724 A1* | 5/2014 | Bayram | ................... H01L 29/04 257/76 |
| 2014/0151714 A1 | 6/2014 | Park et al. | |
| 2015/0014631 A1* | 1/2015 | Ohlsson | .............. H01L 21/0237 257/24 |

OTHER PUBLICATIONS

International Search Report and Written Opinion dated Sep. 14, 2015, issued in corresponding International Application No. PCT/US2014/070950, 9 pages.
Extended European Search Report dated Jun. 25, 2018 for European Patent Application No. 14908580.5, 11 pages.
Tingkai Li et al: "Chapter 2: Challenge of III-V Materials Integration with Si Microelectronics", Jan. 2011, 48 pages.

* cited by examiner

INTEGRATED CIRCUIT DIE HAVING REDUCED DEFECT GROUP III-NITRIDE STRUCTURES AND METHODS ASSOCIATED THEREWITH

CROSS REFERENCE TO RELATED APPLICATIONS

The present application is a national phase entry under 35 U.S.C. § 371 of International Application No. PCT/US2014/070950, filed Dec. 17, 2014, entitled "INTEGRATED CIRCUIT DIE HAVING REDUCED DEFECT GROUP III-NITRIDE STRUCTURES AND METHODS ASSOCIATED THEREWITH," which designates the United States of America, the entire disclosure of which is hereby incorporated by reference in its entirety and for all purposes.

FIELD

Embodiments of the present disclosure generally relate to the field of integrated circuits, and more particularly, to apparatuses and methods associated with an integrated circuit die having group III-Nitride structures.

BACKGROUND

Transistors including group III-Nitride material may be useful for high voltage or high frequency applications, and, as a result, may be promising candidates for system-on-chip (SoC) applications like power management integrated circuits (ICs), radio frequency (RF) power amplifiers, or light emitting diode (LED) applications, for example. However, co-integration of group III-Nitride materials with certain types of semiconductor substrate materials (e.g., silicon (Si)) may be challenging. This is due to potentially large lattice mismatch between the crystalline structure of the group III-Nitride materials and the certain types of semiconductor substrate materials, which may result in high defect density. In addition, mismatch in thermal expansion coefficients between the certain types of substrate materials and group III-Nitride material may result in surface cracks on the group III-Nitride material.

The background description provided herein is for the purpose of generally presenting the context of the disclosure. Unless otherwise indicated herein, the materials described in this section are not prior art to the claims in this application and are not admitted to be prior art by inclusion in this section.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings. Unless clearly indicated otherwise, these drawings are not to scale.

DETAILED DESCRIPTION

Figure 1:
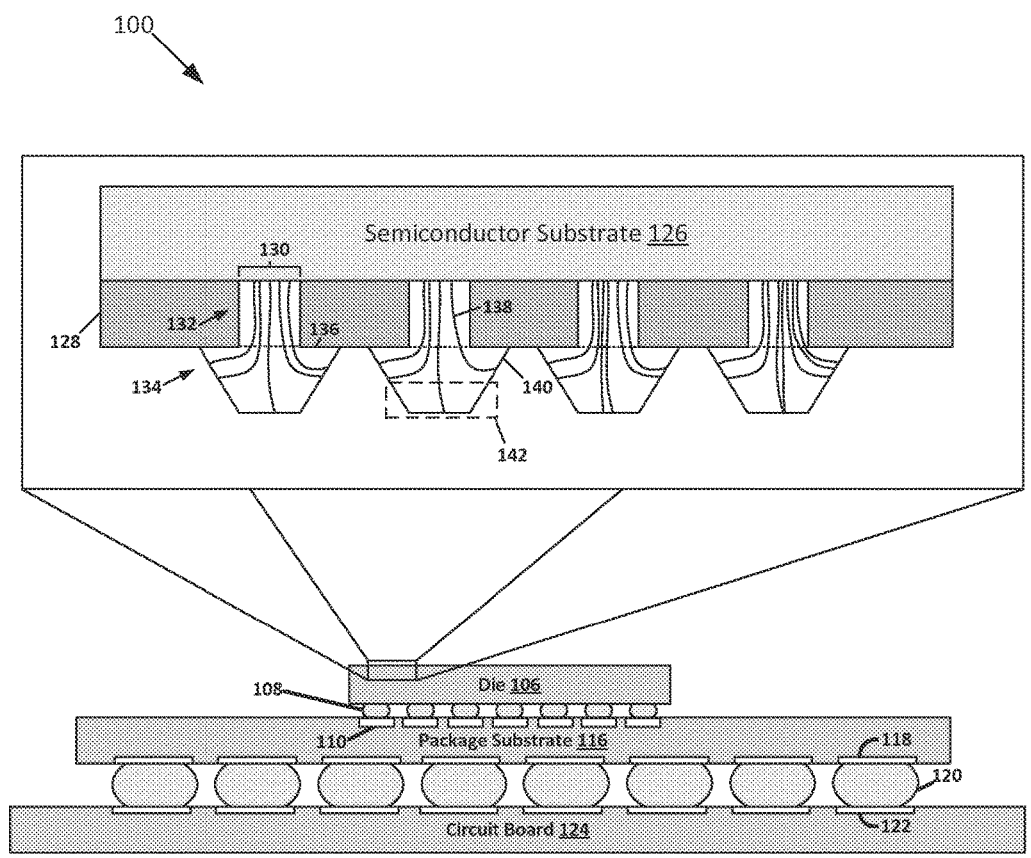
FIG. 1 schematically illustrates a cross-section side view of an example integrated circuit (IC) assembly including an IC die having three-dimensional group III-Nitride structures formed thereon, in accordance with various embodiments of the present disclosure.

Embodiments of the present disclosure describe integrated circuit (IC) die configurations having reduced defect group III-Nitride disposed thereon. In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials, and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings that form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

As used herein, the term "module" may refer to, be part of, or include an Application Specific Integrated Circuit (ASIC), an electronic circuit, a system-on-chip (SoC), a processor (shared, dedicated, or group), and/or memory (shared, dedicated, or group) that execute one or more software or firmware programs, a combinational logic circuit, and/or other suitable components that provide the described functionality.

FIG. 1 schematically illustrates a cross-section side view of an example integrated circuit (IC) assembly 100. In embodiments, the IC assembly 100 may include one or more dies (e.g., die 106) electrically and/or physically coupled with a package substrate 116, as can be seen. The package substrate 116 may further be electrically coupled with a circuit board 124, as can also be seen.

In embodiments, die 106 may include a semiconductor substrate 126. Semiconductor substrate 126 may comprise any suitable semiconductor material, such as, for example, silicon (Si). Die 106 may also include a buffer layer 128 disposed over semiconductor substrate 126. In embodiments, buffer layer 128 may have a plurality of openings (e.g., opening 130) that may be formed through buffer layer 128 to a surface of semiconductor substrate 126. Die 106 may also include a plurality of group III-Nitride structures. As used herein, group III may refer to elements in group IIIA of the chemical abstract services (CAS) grouping, which include boron (B), aluminum (Al), gallium (Ga), indium (In), titanium (Ti). These group III-Nitride structures may include a lower portion (e.g., lower portion 132) disposed in a respective opening of the plurality of openings. The group III-Nitride structures may also include an upper portion (e.g., upper portion 134) disposed over the respective opening. In such embodiments, the upper portions may include a base (e.g., base 136) extending radially from sidewalls of the respective opening. Such a base may be formed over a surface of buffer layer 128 to form a perimeter around the respective opening. Group III-Nitride structures may include, for example, gallium nitride (GaN), indium gallium nitride (InGaN), aluminum gallium nitride (AlGaN), or aluminum indium nitride (AlInN).

Figure 3:
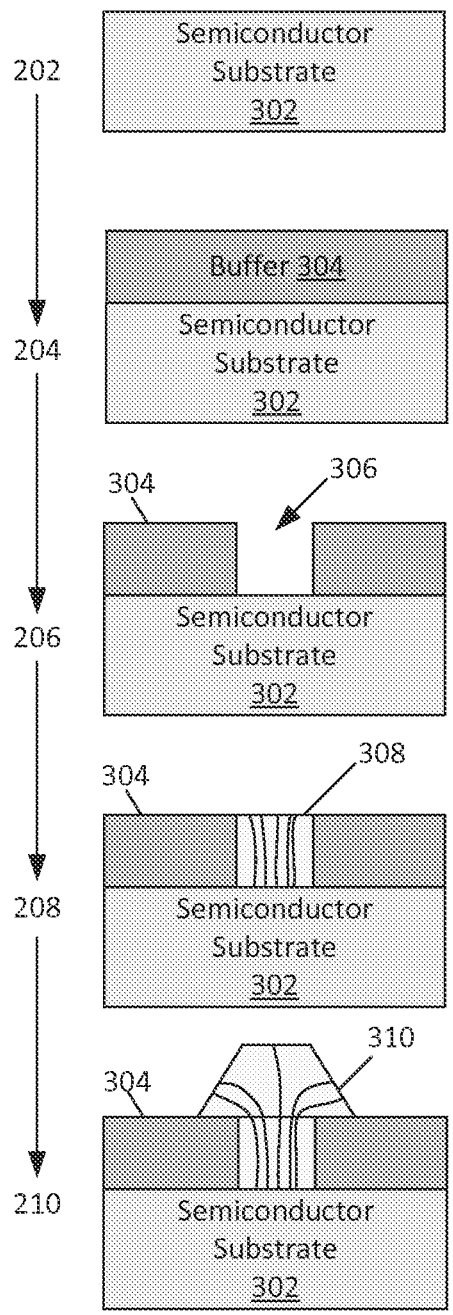
FIG. 3 depicts illustrative cross-section views of selected operations in the IC die fabrication process of FIG. 2, in accordance with various embodiments of the present disclosure.
Figure 4:
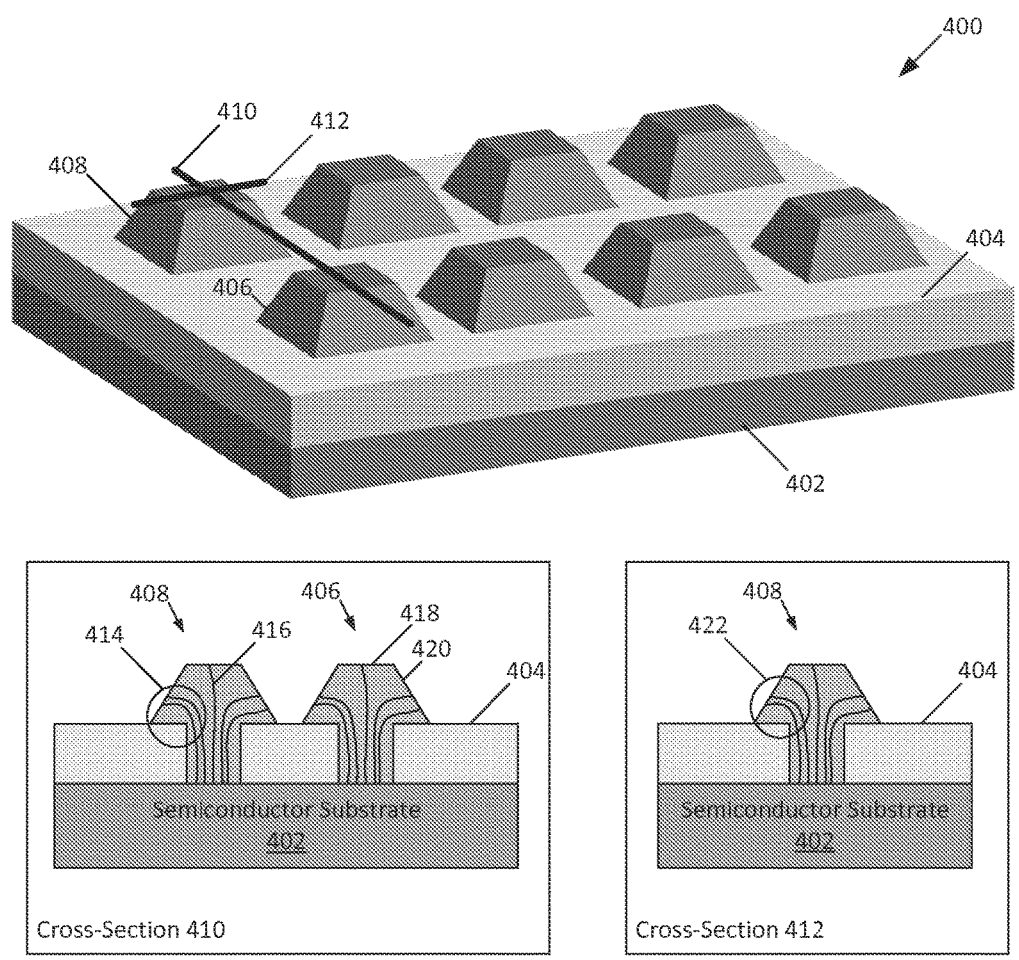
FIGS. 4-6 depict various configurations of an IC die, in accordance with various embodiments of the present disclosure.
Figure 5:
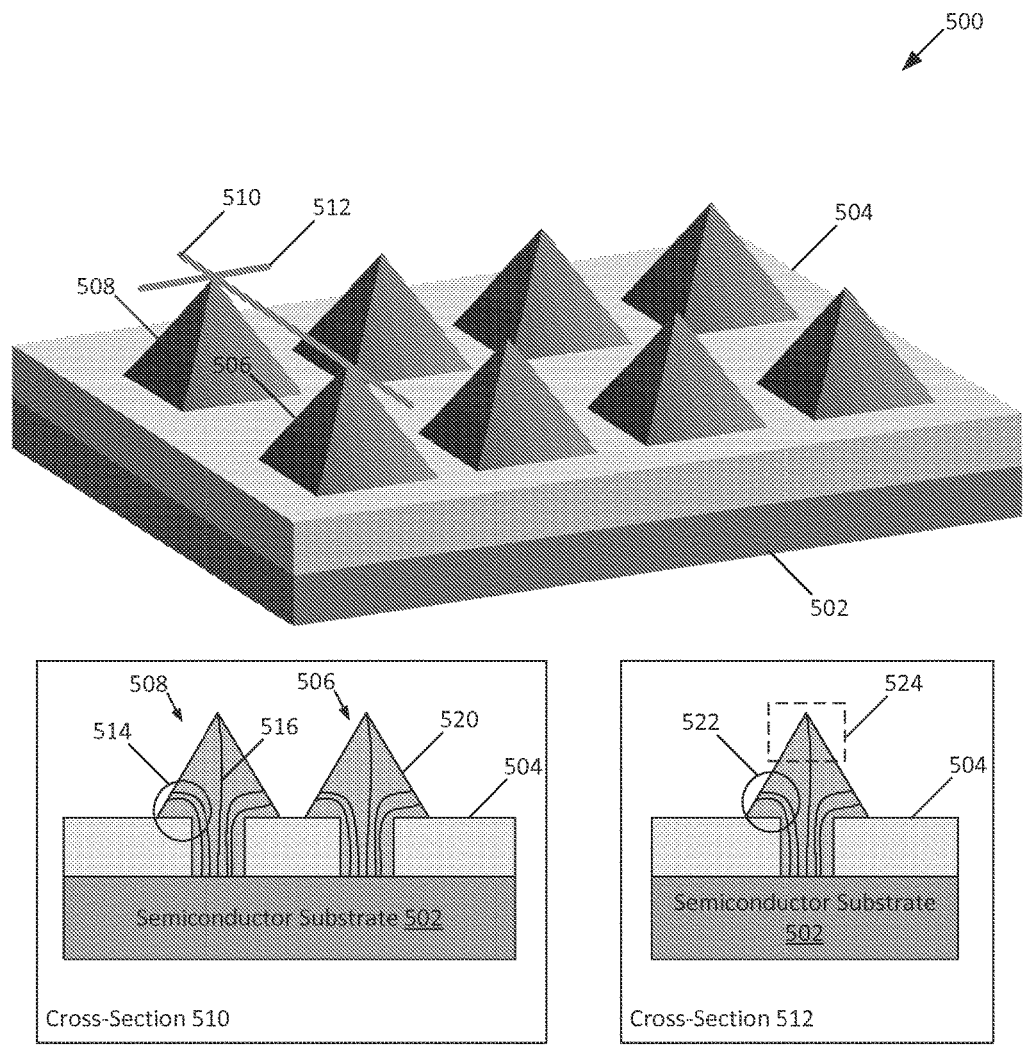
Figure 6:
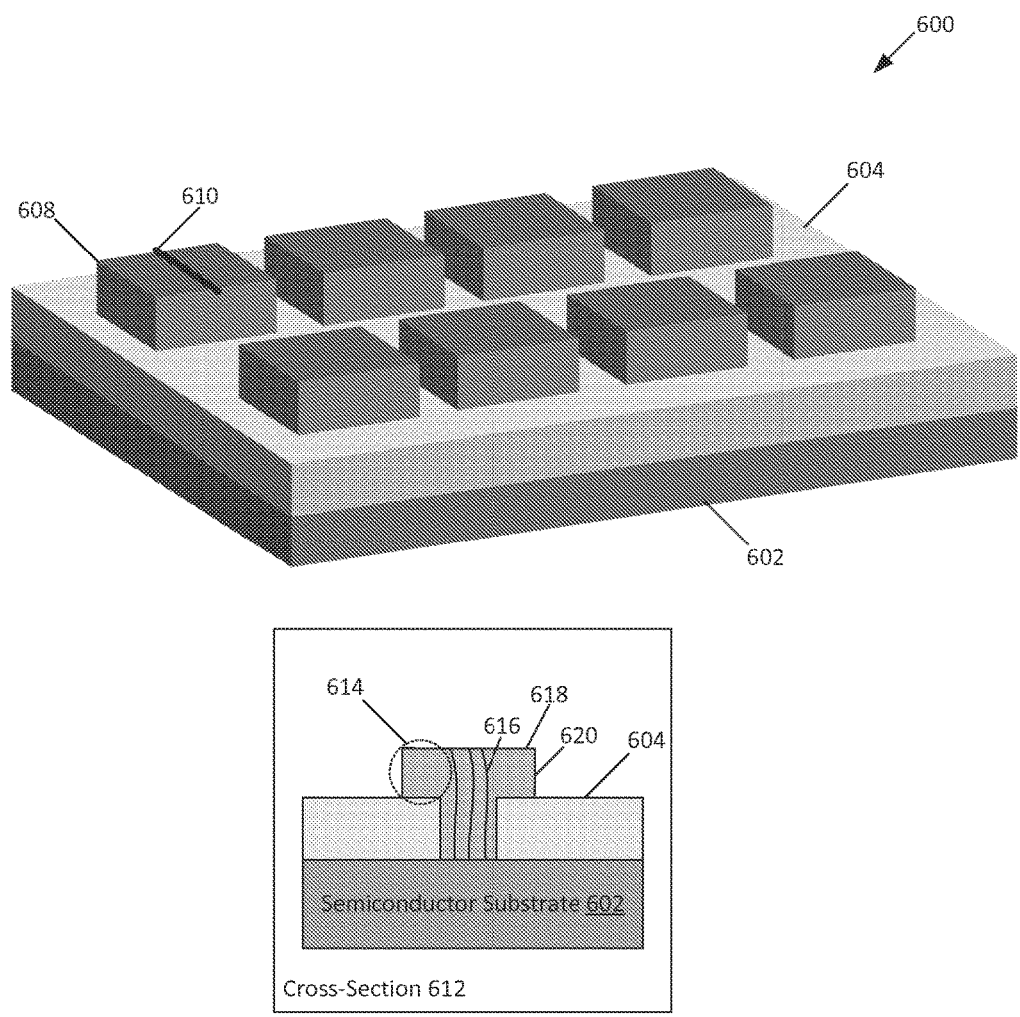

In embodiments, the upper portions of the group III-Nitride structures may be formed under controlled conditions to achieve, for example, a frustum pyramidal shape, such as that depicted by upper portion 134 and discussed further in reference to FIG. 4, a pyramidal shape, such as that depicted in FIG. 5, or a cuboidal shape, such as that depicted in FIG. 6. The formation of the group III-Nitride structures and the various conditions that may be utilized to achieve the various shapes are discussed in reference to FIGS. 2 and 3, below.

In some embodiments, the group III-Nitride structures may be grown, via, for example, metal organic chemical vapor deposition (MOCVD) process, a molecular beam epitaxy (MBE) process, or hybrid vapor phase epitaxy (HVPE) process from each of the plurality of openings. Hereinafter MOCVD may be referenced, however, it will be appreciated that this is merely for illustration and that either MBE or HVPE may be utilized in place of MOCVD in any of these occurrences, unless the context clearly indicates otherwise. Such growth may result in defects (e.g., defect 138) originating from the openings. These defects may include threading dislocations of the group III-Nitride structures that may be caused by a lattice mismatch between the crystalline structure of the semiconductor material of semiconductor substrate 126 and that of the group III-Nitride material of the plurality of group III-Nitride structures.

As can be seen, in the frustum pyramidal embodiment depicted, glide planes for defects of the individual group III-Nitride structures may extend vertically from the surface of semiconductor substrate 126 and terminate at respective faces (e.g., face 140 where defect 138 terminates) of the at least one group III-Nitride structure. Because of these glide planes, defects extending vertically from the opening may be bent to intersect with each face of the at least one group III-Nitride structure along respective glide planes. This creates a bidirectional defect bending effect, which is discussed further in reference to FIGS. 4 and 5 below. This bidirectional defect bending effect may result in an area (e.g., area 142) toward the top of the upper portion of the group III-Nitride structures that has a reduced defect density when compared with the lower portion of the group III-Nitride structures. In addition, by reducing the amount of group III-Nitride material interfacing with semiconductor substrate 126 to that group III-Nitride material disposed in the openings, surface defects that may result from differences in thermal expansion coefficients between the group III-Nitride material and the semiconductor substrate material may be reduced or eliminated.

In embodiments, die 106 may be a system-on-chip (SoC). In such embodiments, the group III-Nitride structures may be utilized as part of a transistor, such as that discussed in further detail in reference to FIG. 12, for a power management integrated circuit for the SoC, or may be part of a radio frequency (RF) power amplifier of the SoC, such as that utilized in a mobile phone. In other embodiments, the group III-Nitride structures may be utilized as part of a light emitting diode (LED) such as that depicted in FIGS. 7-11.

Die 106 may be attached to package substrate 116 according to a variety of suitable configurations, including a flip-chip configuration, as depicted, or other configurations such as, for example, being embedded in the package substrate 116 or being configured in a wirebonding arrangement. In the flip-chip configuration, the die 106 may be attached to a surface of the package substrate 116 via die interconnect structures 108 such as bumps, pillars, or other suitable structures that may also electrically couple die 106 with the package substrate 116.

Die 106 may represent a discrete chip made from a semiconductor material and may be, include, or be a part of a processor, memory, or ASIC in some embodiments. In some embodiments, an electrically insulative material such as, for example, molding compound or underfill material (not pictured) may partially encapsulate a portion of die 106 and/or interconnect structures 108. Die interconnect structures 108 may be configured to route the electrical signals between die 106 and package substrate 116.

Package substrate 116 may include electrical routing features configured to route electrical signals to or from die 106. The electrical routing features may include, for example, traces disposed on one or more surfaces of package substrate 116 and/or internal routing features such as, for example, trenches, vias, or other interconnect structures to route electrical signals through package substrate 116. For example, in some embodiments, package substrate 116 may include electrical routing features (such as die bond pads 110) configured to receive the die interconnect structures 108 and route electrical signals between die 106 and package substrate 116. In some embodiments, the package substrate 116 is an epoxy-based laminate substrate having a core and/or build-up layers such as, for example, an Ajinomoto Build-up Film (ABF) substrate.

The circuit board 124 may be a printed circuit board (PCB) composed of an electrically insulative material such as an epoxy laminate. For example, the circuit board 124 may include electrically insulating layers composed of materials such as, for example, polytetrafluoroethylene, phenolic cotton paper materials such as Flame Retardant 4 (FR-4), FR-1, cotton paper and epoxy materials such as CEM-1 or CEM-3, or woven glass materials that are laminated together using an epoxy resin prepreg material. Structures (not shown), for example, vias, may be formed through the electrically insulating layers to route the electrical signals of the die 106 through the circuit board 124. The circuit board 124 may be composed of other suitable materials in other embodiments. In some embodiments, the circuit board 124 is a motherboard (e.g., motherboard 1302 of FIG. 13).

Package-level interconnects such as, for example, solder balls 120 or land-grid array (LGA) structures may be coupled to one or more lands (hereinafter "lands 118") on package substrate 116 and one or more pads 122 on the circuit board 124 to form corresponding solder joints that are configured to further route the electrical signals between the package substrate 116 and the circuit board 124. Other suitable techniques to physically and/or electrically couple the package substrate 116 with the circuit board 124 may be used in other embodiments.

Figure 2:
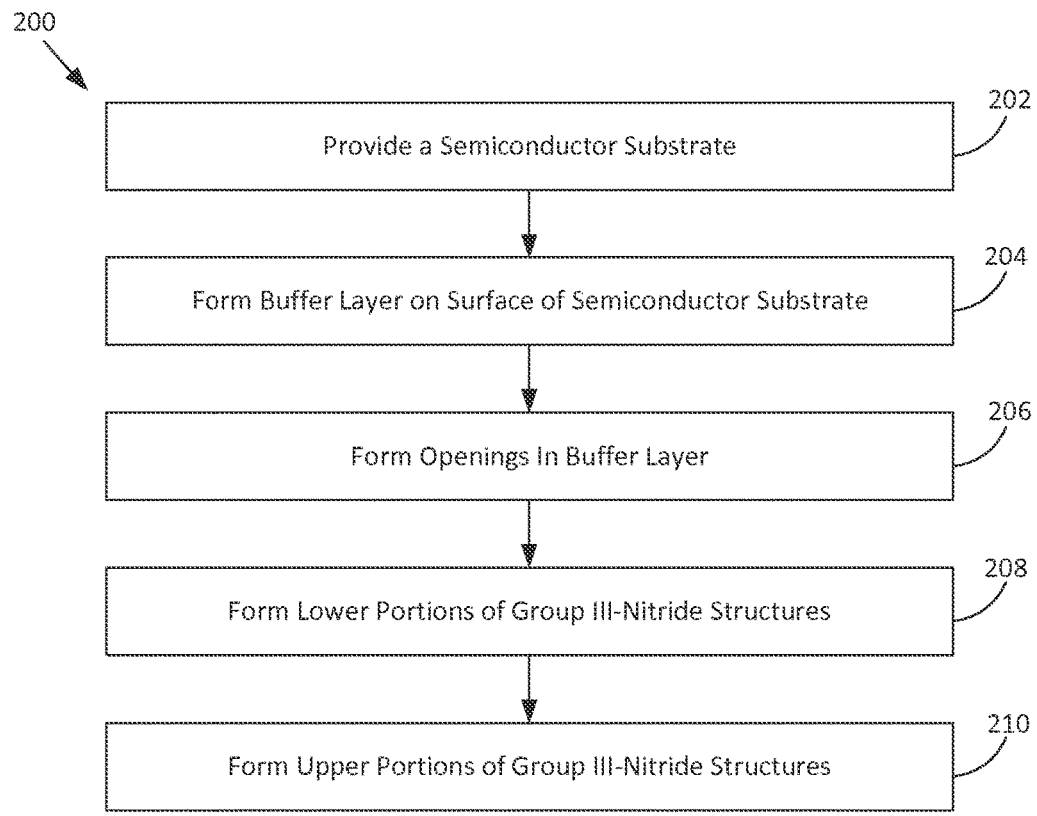
FIG. 2 is an illustrative flow diagram of an integrated circuit (IC) die fabrication process in accordance with various embodiments of the present disclosure.

FIG. 2 is an illustrative flow diagram of an integrated circuit (IC) die fabrication process 200 in accordance with various embodiments of the present disclosure. FIG. 3 provides cross-section views of selected operations illustrating stages in the IC die fabrication process 200, in accordance with various embodiments. As a result, FIGS. 2 and 3 will be described in conjunction with one another. To aid in this description, the operations performed in FIG. 2 are referenced on the arrows moving from operation to operation in FIG. 3.

Process 200 may begin at block 202 where a semiconductor substrate 302 may be provided. Such a semiconductor substrate may comprise any suitable material including silicon, such as a silicon wafer cut along the 100 plane, the 111 plane, or the 110 plane without miscut, or with miscut ranging from 0.5 degrees to 8 degrees. At block 204 buffer layer 304 may be formed. Buffer layer 304 may comprise any suitable buffer material, such as aluminum oxide ($Al_2O_3$), silicon dioxide ($SiO_2$), silicon nitride (SiN), hafnium oxide (HfO2), tantalum silicon oxide (TaSiOx), aluminum silicon oxide (AlSiOx), SiON, silicon carbonitride (SiCN), titanium dioxide (TiO2), etc. In embodiments where the IC die resulting from process 200 is to be utilized as part of an LED, hereinafter referred to collectively as "LED embodiments," the buffer material for buffer layer 304 may be selected based upon a level of transparency or translucency. In some embodiments, a reflective layer (e.g., reflective layer 704, 804, 904, and 1004 of FIGS. 7-10, respectively) may be formed prior to forming buffer layer 304. In LED embodiments, such a reflective layer may be utilized to reflect light emitted toward semiconductor substrate 302 by the LED, which may normally be absorbed by semiconductor substrate 302.

At block 206 opening 306 may be formed in buffer layer 304. In embodiments, the dimensions of opening 306 may be in the range of 10 nanometers (nm) to 10 micrometers (um), or even smaller or larger depending on the application. As depicted, opening 306 may reveal a portion of the surface of semiconductor substrate 302. Such an opening may be formed through any conventional process, including, but not limited to, a photolithography process.

In some embodiments, a cladding layer may be formed between blocks 206 and 208. Such a cladding layer may comprise aluminum nitride (AlN), boron nitride (BN), or titanium nitride (TiN), and may be deposited by way of chemical vapor deposition, atomic layer deposition, molecular beam epitaxy, or a sputtering process. The cladding layer may permit nucleation of foreign material on the semiconductor substrate 302. For example, an AlN cladding layer may prevent the mixing of group III-Nitride atoms with semiconductor substrate 302. For example, at high temperature, Ga atoms and Si atoms may react with one another, which may prevent epitaxial growth of GaN.

At block 208, a lower portion 308 of a group III-Nitride structure, such as that discussed elsewhere herein, may be formed. In embodiments, lower portion 308 may comprise, for example, gallium nitride (GaN), or any other group III-Nitride materials, and may be formed through, for example, an MOCVD process. In at least LED embodiments, lower portion 308 may further comprise, or be doped with, oxygen (O), silicon Si, or germanium (Ge), which may result in lower portion 308 being n-doped group III-Nitride.

At block 210, an upper portion 310 of the group III-Nitride structure, such as that discussed elsewhere herein, may be formed. In embodiments, upper portion 310 may comprise the same materials as lower portion 308, and may be formed through lateral epitaxial overgrowth (LEO) by, for example, MOCVD.

In embodiments, conditions of LEO may be controlled to result in various shapes of the upper portion (e.g., frustum pyramidal, pyramidal, or cuboidal). Pressure, temperature, and V/III gas mixture ratio are all conditions of the growth process that may contribute to the shape of the growth (e.g., whether the sidewalls are vertical or inclined). Lower growth pressure may favor growth of vertical sidewall planes, while higher growth pressure may favor the inclined sidewall planes. For example, pressure conditions in growing GaN may range from 30 to 350 Torr. Temperature may also be controlled to favor the inclined sidewall facets described above. A higher growth temperature may favor the growth of vertical sidewall planes, whereas a lower growth temperature may favor the inclined sidewall facets. For example, temperature conditions in growing GaN may range from 900 to 1150° C. In addition, group V/group III precursor gas mixture ratio may also be controlled to favor the inclined sidewall facets described above. A lower V/III ratio may favor vertical sidewall planes, whereas a higher V/III ratio may favor the formation of inclined sidewall facets. For example, in embodiments where the group III-Nitride is GaN, the group V precursor is ammonia (NH$_3$), and the group III precursor is tri-methyl-gallium (TMG), the V/III ratio may be in the range of 100-5000. Following this guidance, one of ordinary skill may determine a suitable LEO process space that may be further utilized in any of the methods described herein to fabricate the various structures and devices described herein.

FIGS. 4-6 depict perspective views and associated cross-sections of various configurations of an IC die, in accordance with various embodiments of the present disclosure. FIG. 4 depicts an IC die 400 along with cross-sections 410 and 412 that are taken along the planes identified in the perspective view. In embodiments, die 400 may include a semiconductor substrate 402 and a buffer layer 404, such as those described above. In embodiments, buffer layer 404 may have a plurality of openings, depicted in cross-sections 410 and 412, that may be formed through buffer layer 404 to a surface of semiconductor substrate 402.

As discussed above, the plurality of group III-Nitride structures may include a lower portion, depicted in cross-sections 410 and 412, disposed in a respective opening of the plurality of openings. The group III-Nitride structures may also include an upper portion (e.g., upper portions 406 and 408) disposed over the respective opening. In embodiments, the upper portions of the group III-Nitride structures may be formed under controlled conditions to achieve the depicted frustum pyramidal shape. The formation of the group III-Nitride structures and the various conditions that may be utilized to achieve the frustum pyramidal shape are discussed in reference to FIGS. 2 and 3, above.

As discussed above, in some embodiments, the group III-Nitride structures may be grown, via, for example, MOCVD, from each of the plurality of openings. Such growth may result in defects (e.g., defects 414, 416, and 422) originating from the openings. These defects may include threading dislocations of the group III-Nitride structure that may be caused by a lattice mismatch between the crystalline structure of the semiconductor material of semiconductor substrate 402 and that of the group III-Nitride material of the plurality of group III-Nitride structures.

As can be seen, in the frustum pyramidal embodiment depicted, glide planes for defects of the individual group III-Nitride structures may extend vertically from the surface of semiconductor substrate 402 and terminate at respective faces of the frustum pyramid. Because of these glide planes, defects extending vertically from the opening may be bent, as depicted by defects 414 and 422, to intersect with each face of the at least one group III-Nitride structure along respective glide planes. This creates a bidirectional defect bending effect. This bidirectional defect bending effect is illustrated by the two cross-sections depicted. As can be seen in cross-section 410, defects 414 bend toward angled faces of frustum pyramidal upper portion 408. Cross-section 412 depicts another cross-section of frustum pyramidal upper portion 408 taken at an angle perpendicular to that of cross-section 410. As can be seen in cross-section 412, defects 422 also bend toward the angled faces of frustum pyramidal upper portion 408. This bidirectional defect bending effect then results in defects being bent to intersect with each of the four faces of frustum pyramidal upper portion 408 and provides for an area (e.g., area 142 of FIG. 1) that may have a reduced defect density when compared with the lower portion of the same group III-Nitride structure.

In addition, surfaces of such a frustum pyramidal upper portion of a group III-Nitride structure may exhibit different polarities depending on the plane in which the surface lies. For group III-Nitride structures, a surface lying in the horizontal plane, also known as the c-plane, may have polarization properties, while surfaces lying in the vertical plane, or m-plane, may not. As a result, the frustum pyramidal shape of the upper portions depicted may provide for a top surface (e.g., top surface 418) that may have polarization properties, while the angled surfaces of the faces (e.g., angled surface 420) may have semi-polar properties due to the angled surfaces lying in both the vertical and horizontal plane. As a result, the frustum pyramidal upper portions may demonstrate different effects depending upon the application. For example, in a transistor application, angled surfaces of faces of a frustum pyramidal upper section may provide for an area of relatively lower charge than the top surface. As another example, in an LED application, angled surfaces of faces of a frustum pyramidal upper section may provide for different wavelengths of light than the top surface.

FIG. 5 depicts an IC die 500 along with cross-sections 510 and 512 that are taken along the planes identified in the perspective view. In embodiments, die 500 may include a semiconductor substrate 502 and a buffer layer 504, such as those described above. In embodiments, buffer layer 504 may have a plurality of openings, depicted in cross-sections 510 and 512, that may be formed through buffer layer 504 to a surface of semiconductor substrate 502.

As discussed above, the plurality of group III-Nitride structures may include a lower portion, depicted in cross-sections 510 and 512, disposed in a respective opening of the plurality of openings. The group III-Nitride structures may also include an upper portion (e.g., upper portions 506 and 508) disposed over the respective opening. In embodiments, the upper portions of the group III-Nitride structures may be formed under controlled conditions to achieve the depicted pyramidal shape. The formation of the group III-Nitride structures and the various conditions that may be utilized to achieve the pyramidal shape are discussed in reference to FIGS. 2 and 3, above.

As discussed above, in some embodiments, the group III-Nitride structures may be grown, via, for example, MOCVD, from each of the plurality of openings. Such growth may result in defects (e.g., defects 514, 516, and 522) originating from the openings. These defects may include threading dislocations of the group III-Nitride structure that may be caused by a lattice mismatch between the crystalline structure of the semiconductor material of semiconductor substrate 502 and that of the group III-Nitride material of the plurality of group III-Nitride structures.

As can be seen, in the pyramidal embodiment depicted, glide planes for defects of the individual group III-Nitride structures may extend vertically from the surface of semiconductor substrate 502 and terminate at respective faces of the pyramid. Because of these glide planes, defects extending vertically from the opening may be bent, as depicted by defects 514 and 522, to intersect with each face of the at least one group III-Nitride structure along respective glide planes. This creates a bidirectional defect bending effect. This bidirectional defect bending effect is illustrated by the two cross-sections depicted. As can be seen in cross-section 510, defects 514 bend toward angled faces of pyramidal upper portion 508. Cross-section 512 depicts another cross-section of pyramidal upper portion 508 taken at an angle perpendicular to that of cross-section 510. As can be seen in cross-section 512, defects 522 also bend toward the angled faces of pyramidal upper portion 508. This bidirectional defect bending effect then results in defects being bent to intersect with each of the four faces of pyramidal upper portion 508 and provides for an area (e.g., area 524) that may have a reduced defect density when compared with the lower portion of the same group III-Nitride structure.

In addition, surfaces of such a pyramidal upper portion of a group III-Nitride structure may exhibit different polarities depending on the plane in which the surface lies. As discussed above, for group III-Nitride structures, a surface lying in the horizontal plane, also known as the c-plane, may have polarization properties, while surfaces lying in the vertical plane, or m-plane, may not. As a result, the pyramidal shape of the upper portions depicted may provide for angled surfaces of the faces (e.g., angled surface 520) that may have semi-polar properties due to the angled surfaces lying in both the vertical and horizontal plane. In some embodiments, the faces of the pyramidal upper portion may lie in, for example, the 11-22 plane.

FIG. 6 depicts an IC die 600 along with cross-section 610 that is taken along the plane identified in the perspective view. In embodiments, die 600 may include a semiconductor substrate 602 and a buffer layer 604, such as those described above. In embodiments, buffer layer 604 may have a plurality of openings, depicted in cross-section 610, that may be formed through buffer layer 604 to a surface of semiconductor substrate 602.

As discussed above, the plurality of group III-Nitride structures may include a lower portion, depicted in cross-sections 610 and 612, disposed in a respective opening of the plurality of openings. The group III-Nitride structures may also include an upper portion (e.g., upper portion 608) disposed over the respective opening. In embodiments, the upper portions of the group III-Nitride structures may be formed under controlled conditions to achieve the depicted cuboidal shape. The formation of the group III-Nitride structures and the various conditions that may be utilized to achieve the cuboidal shape are discussed in reference to FIGS. 2 and 3, above.

As discussed above, in some embodiments, the group III-Nitride structures may be grown, via, for example, MOCVD, from each of the plurality of openings. Such growth may result in defects (e.g., defect 616) originating from the openings. These defects may include threading dislocations of the group III-Nitride structure that may be caused by a lattice mismatch between the crystalline structure of the semiconductor material of semiconductor substrate 602 and that of the group III-Nitride material of the plurality of group III-Nitride structures.

As can be seen, in the cuboidal embodiment depicted, glide planes for defects of the individual group III-Nitride structures may extend vertically from the surface of semiconductor substrate 602 and terminate at the top of the cuboidal upper portion. As depicted, regions (e.g., region 614) of the cuboidal structure disposed above the buffer layer may have a reduced defect density in comparison to semiconductor material disposed above the opening.

In addition, surfaces of such a cuboidal upper portion of a group III-Nitride structure may exhibit different polarities depending on the plane in which the surface lies. As discussed above, for group III-Nitride structures, a surface lying in the horizontal plane, also known as the c-plane, may have polarization properties, while surfaces lying in the vertical plane, or m-plane, may not. As a result, the cuboidal shape of the upper portions depicted may provide for vertical sidewall surfaces (e.g., vertical surface 620) that may be non-polar, while horizontal surface 618 may be polar.

Figure 7:
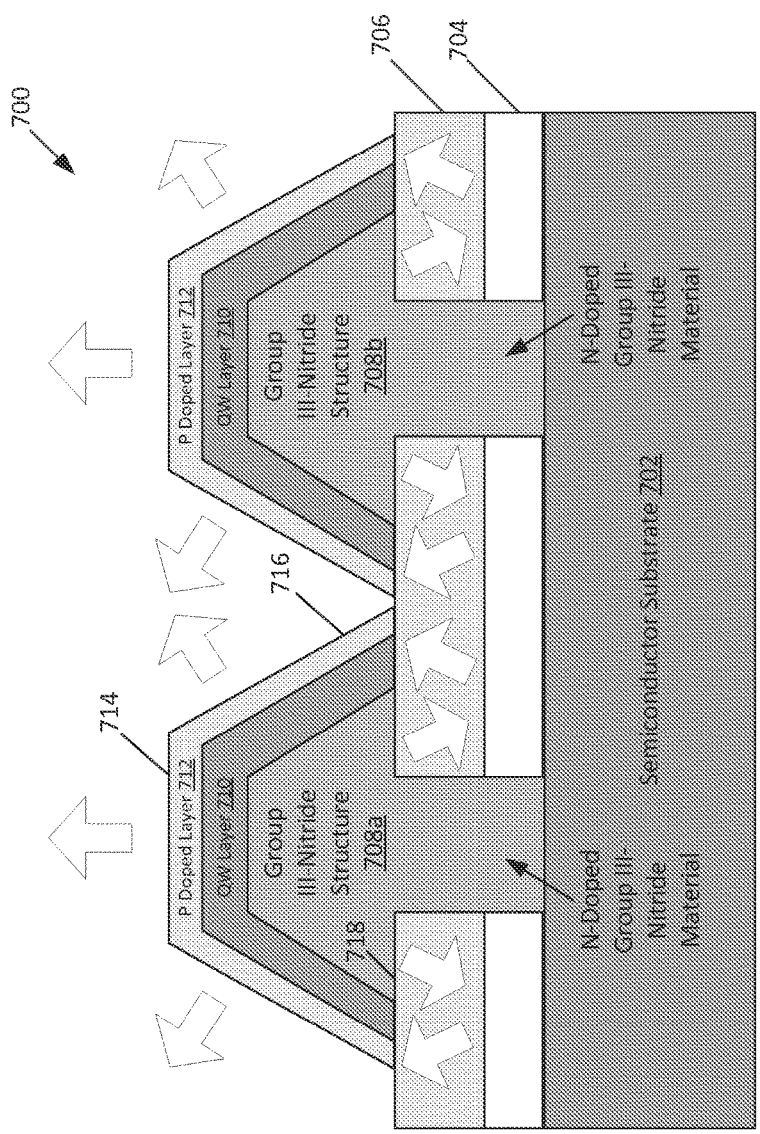
FIGS. 7-10 depict various configurations of an IC die having group III-Nitride structures, disposed thereon, configured as light emitting diodes (LEDs), in accordance with the present disclosure.

FIG. 7 depicts an IC die 700 configured as a light emitting diode (LED). In embodiments, die 700 may include a semiconductor substrate 702 and buffer layer 706, such as that discussed elsewhere herein. In addition, die 700 may include a reflective layer 704 disposed between semiconductor substrate 702 and buffer layer 706. Reflective layer 704 may comprise any reflective material, such as, for example, silver (Ag), aluminum (Al), gold (Au), any other suitably reflective metallic films, or any periodic layers of a layer of low refractive index material and a layer of high refractive index material (e.g., a layer of zinc sulfide (refractive index, n=2.3) and silicon dioxide (n=1.49) or magnesium fluoride (n=1.38)). In embodiments, buffer layer 706 and reflective layer 704 may have a plurality of openings that may be formed through buffer layer 706 and reflective layer 704 to a surface of semiconductor substrate 702.

Die 700 may also include a plurality of group III-Nitride structures 708a and 708b, such as those discussed above. In some embodiments, at least the lower portion of the group III-Nitride structure may comprise n-doped group III-Nitride material. n-doped group III-Nitride material may include group III-Nitride material that has been doped with, for example, one of Si or O. In embodiments, the n-doped group III-Nitride may range in thickness from approximately 250 nm to approximately 700 nm and may spill over to the upper portion of group III-Nitride structures 708a and 708b.

In embodiments, quantum well layer 710 may be disposed on group III-Nitride structures 708a and 708b. In embodiments, quantum well layer 710 may comprise a sub-layer of lower band-gap material disposed between sub-layers of higher band-gap material. These higher and lower band-gap materials may be selected from, for example, gallium nitride (GaN), indium gallium nitride (InGaN), aluminum gallium nitride (AlGaN), or aluminum indium nitride (AlInN). In embodiments, the lower band-gap sub-layer and the higher band-gap sub-layer may each range in thickness between approximately 1 nm and 30 nm. In some embodiments, these high and low band-pass layers may be repeated between approximately 2 and 10 times. The high band-pass and low band-pass materials utilized in quantum well layer 710 may be selected based upon a color that the LED is to produce.

In embodiments, a P-doped group III-Nitride layer 712 may be disposed over quantum well layer 710. P-doped group III-Nitride material may include group III-Nitride material doped with magnesium (Mg). P-doped group III-Nitride layer 712 may, in some embodiments, range in thickness from approximately 100 nm to approximately 200 nm.

The arrows surrounding the frustum pyramidal structures, or LEDs, described above indicate light emitted by the LEDs of IC die 700. As depicted, the light may be emitted in multiple directions, including from the top surface (e.g., top surface 714) of the frustum pyramidal structures, from face surfaces (e.g., face surface 716) of the frustum pyramidal structures, and from bases (e.g., base 718) of the frustum pyramidal structures. Because light is emitted by the faces of the frustum pyramidal structures in addition to the top surface, the total surface area emitting light is greater than that of an LED emitting light from a single horizontal plane. In addition, in embodiments that include reflective layer 704, light emitted from the bases of the frustum pyramidal structures may be reflected back out to further increase the amount of light emitted by such an LED.

Figure 8:
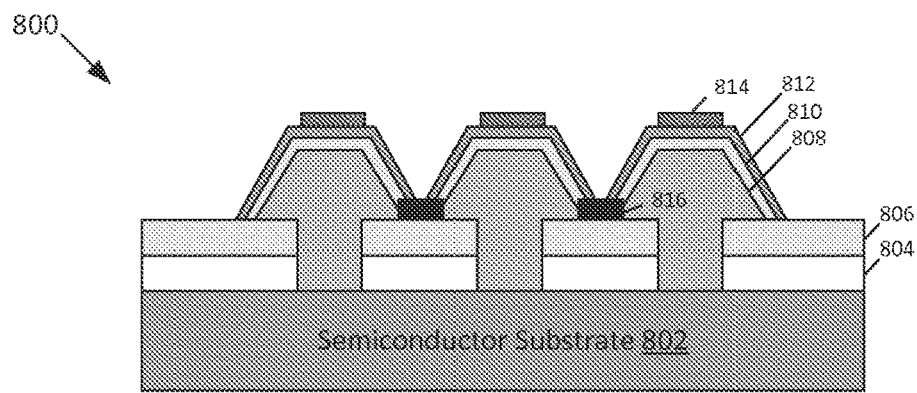
Figure 9:
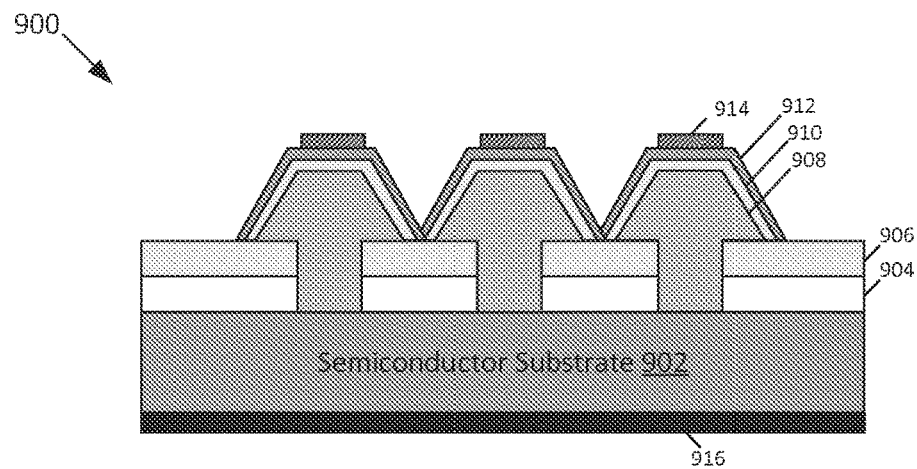
Figure 10:
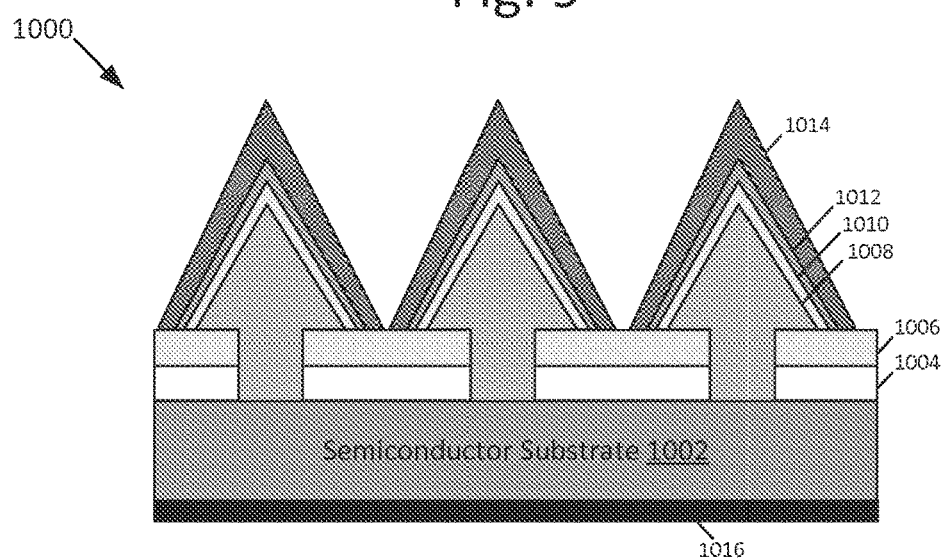

FIGS. 8-10 depict various configurations of an IC die having 3-D group III-Nitride structures, disposed thereon, configured as light emitting diodes (LEDs), in accordance with the present disclosure. FIG. 8 depicts a cross-section of an IC die 800 configured with light emitting diodes (LEDs) in a similar manner to that discussed in reference to FIG. 7, above. In embodiments, die 800 may include a semiconductor substrate 802, reflective layer 804 disposed over semiconductor substrate 802, and buffer layer 806 disposed over reflective layer 804. Die 800 may also include a plurality of group III-Nitride structures (e.g., group III-Nitride structure 808). In embodiments, die 800 may further comprise quantum well layer 810 disposed over the group III-Nitride structures and a P-doped group III-Nitride layer 812 disposed over quantum well layer 810. All of these elements of die 800 may comprise the same materials discussed above in reference to FIG. 7.

In addition, die 800 may have a p-type ohmic contact disposed on the P-doped group III-Nitride layer 812 (e.g., p-type ohmic contact 814). Such a p-type ohmic contact may be formed after formation of the P-doped group III-Nitride layer. An n-type ohmic contact may also be disposed between individual ones of the group III-Nitride structures (e.g., n-type ohmic-contact 816). Such an n-type ohmic contact may be formed prior to formation of the group III-Nitride structures, and the group III-Nitride structures may be grown to contact the n-type ohmic contact or may be formed after formation of the group III-Nitride structures and before formation of quantum well layer 810 and P-doped group III-Nitride layer 812.

FIG. 9 depicts a cross-section of an IC die 900 configured as LEDs in a similar manner to that discussed in reference to FIG. 7, above. In embodiments, die 900 may include a semiconductor substrate 902, reflective layer 904 disposed over semiconductor substrate 902, and buffer layer 906 disposed over reflective layer 904. Die 900 may also include a plurality of group III-Nitride structures (e.g., group III-Nitride structure 908). In embodiments, die 900 may further comprise quantum well layer 910 disposed over the group III-Nitride structures and a P-doped group III-Nitride layer 912 disposed over quantum well layer 910. All of these elements of die 900 may comprise the same materials discussed above in reference to FIG. 7.

As with die 800, discussed above, die 900 may have a p-type ohmic contact disposed on the P-doped group III-Nitride layer 912 (e.g., p-type ohmic contact 914). However, rather than having n-type ohmic contacts disposed between the group III-Nitride structures as depicted with die 800, an n-type ohmic contact layer 916 may be disposed on a side of semiconductor substrate 902 opposite that of the LED formations. In such embodiments, semiconductor substrate 902 may comprise an n-doped semiconductor material, such as, for example, n-doped silicon.

FIG. 10 depicts a cross-section of an IC die 1000 configured as LEDs in a similar manner to that discussed in reference to FIG. 7, above. As with the above discussed embodiments depicted in FIGS. 8 and 9, die 1000 may include a semiconductor substrate 1002, reflective layer 1004 disposed over semiconductor substrate 1002, and buffer layer 1006 disposed over reflective layer 1004. Die 1000 may also include a plurality of group III-Nitride structures (e.g., group III-Nitride structure 1008). In embodiments, die 1000 may further comprise quantum well layer 1010 disposed over the group III-Nitride structures and a P-doped group III-Nitride layer 1012 disposed over quantum well layer 1010. All of these elements of die 1000 may comprise the same materials discussed above in reference to FIG. 7.

As depicted in FIG. 10 though, the group III-Nitride structures may be pyramidal in shape, rather than the frustum pyramidal shape depicted in FIGS. 7-9. Die 1000 may have a p-type ohmic contact layer disposed over the P-doped group III-Nitride layer 1012 (e.g., p-type ohmic contact 1014). In addition, as depicted, an n-type ohmic contact layer 1016 may be disposed on a side of semiconductor substrate 1002 opposite that of the LED formations. In such embodiments, semiconductor substrate 902 may comprise an n-doped semiconductor material, such as, for example, n-doped silicon.

While depicted above in pyramidal and frustum pyramidal embodiments, it will be appreciated that the above embodiments would also apply to the cuboidal embodiments discussed herein. In addition, while only a single shape of the upper portion of the group III-Nitride structures is depicted in each figure, it will be appreciated that, in some embodiments, various different shaped upper portions may be integrated on the same die. This may be accomplished by repeating procedures 206-210 of process 200 discussed above under different conditions to result in the group III-Nitride structures being formed in the various different shapes. For example, a die, in some embodiments, may have any combination of frustum pyramidal shaped group III-Nitride structures, pyramidal shaped group III-Nitride structures, or cuboidal shaped group III-Nitride structures formed thereon. In such embodiments, each shape may be configured to emit a different wavelength, or color, of light.

Figure 11:
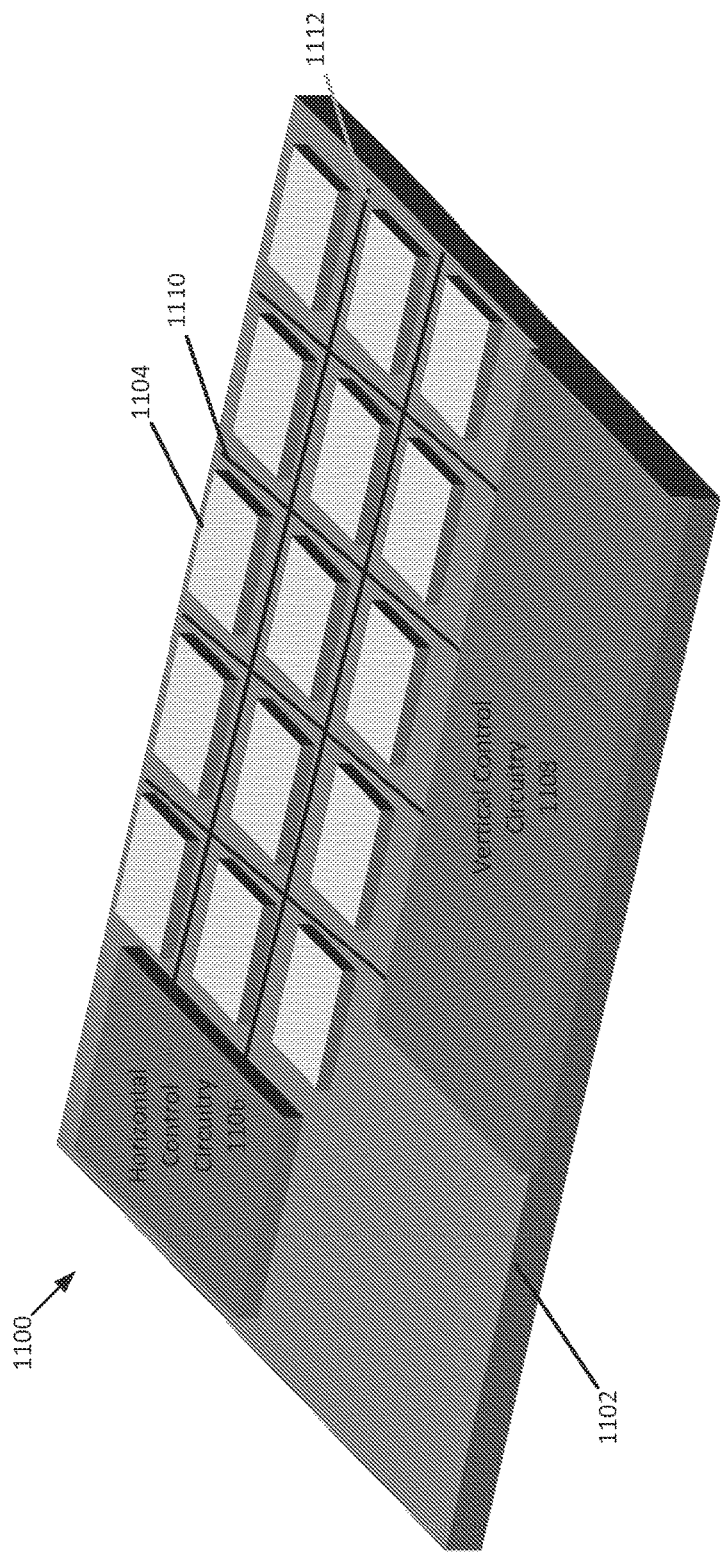
FIG. 11 schematically illustrates a display configuration utilizing group III-Nitride structures in accordance with various embodiments of the present disclosure.

FIG. 11 schematically illustrates a display configuration 1100 utilizing group III-Nitride structures in accordance with various embodiments of the present disclosure. In some embodiments, display configuration 1100 may be implemented as a die. In such embodiments, blocks of one or more LEDs (e.g., block 1104), such as those discussed above in reference to FIGS. 7-10, may be disposed on semiconductor substrate 1102. In various embodiments, semiconductor substrate 1102 may also include a buffer layer and reflective layer disposed thereon, as discussed above. As depicted, the LEDs may be disposed on display configuration 1100 in a matrix configuration in rows and columns. Display configuration 1100 may, in some embodiments, also include one or more control circuits, such as horizontal control circuitry 1106 and vertical control circuitry 1108. In embodiments, vertical control circuitry 1108 may be coupled with columns of the blocks of one or more LEDs via metal lines/interconnects 1110, while horizontal control circuitry 1106 may be coupled with rows of the blocks of one or more LEDs via metal lines/interconnects 1112. Such a configuration may enable control of individual blocks of one or more LEDs. In some embodiments, the horizontal control circuitry 1106 and the vertical control circuitry 1108 may be implemented as complementary metal oxide semiconductor (CMOS) devices.

In other embodiments, display configuration 1100 may be implemented as an integrated circuit assembly. In such embodiments, semiconductor substrate 1102 may be replaced with a circuit board (e.g., circuit board 124), and each of the blocks of one or more LEDs may represent individual dies, such as dies 700, 800, 900, or 1000 discussed above, coupled with the circuit board. In such embodiments, horizontal control circuitry 1106 and vertical control circuitry 1108 may also be implemented as one or more dies coupled with the circuit board.

Figure 12:
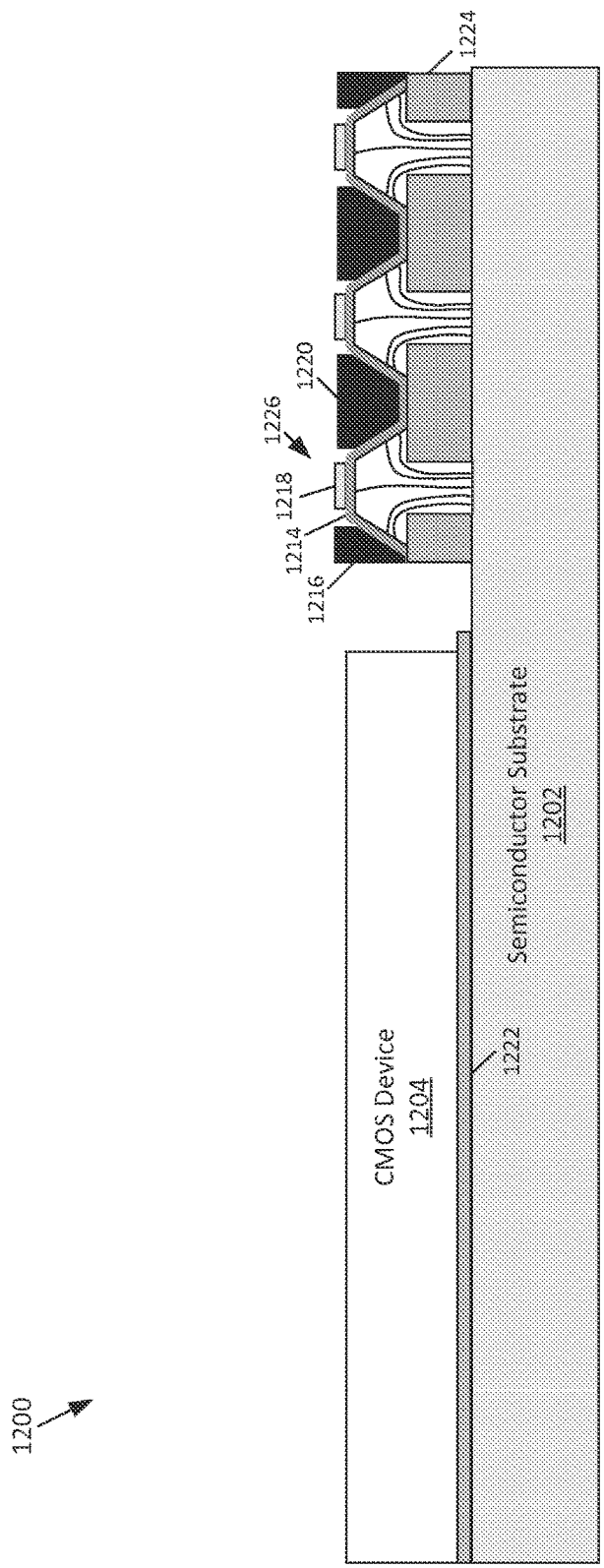
FIG. 12 schematically illustrates a cross-section side view of an example integrated circuit (IC) assembly including an IC die having reduced defect density group III-Nitride formed thereon, in accordance with various embodiments of the present disclosure.

FIG. 12 schematically illustrates a cross-section side view of an example integrated circuit (IC) die 1200 including group III-Nitride structures formed thereon, in accordance with various embodiments of the present disclosure. In embodiments, die 1200 may include a semiconductor substrate 1202, and buffer layer 1224 disposed over semiconductor substrate 1202. Die 1200 may also include a plurality of group III-Nitride structures (e.g., group III-Nitride structure 1226). All of these elements of die 1200 may comprise the same materials discussed above.

As depicted, areas between the group III-Nitride structures may, in some embodiments, be used in the formation of transistors on the group III-Nitride structures. For example, as depicted, source 1216 of a transistor may be disposed on one side of group III-Nitride structure 1226, while a drain 1220 of the transistor may be disposed on an opposite side. In such embodiments, a gate 1218 of the transistor may be disposed on a top surface of the group III-Nitride structure between source 1216 and drain 1220 of the transistor. In some embodiments, a two-dimensional electron gas (2DEG) induction layer 1214 may be disposed on a surface of the group III-Nitride structures. Such a 2DEG induction layer may comprise aluminum gallium nitride (AlGaN), aluminum indium nitride (AlInN), aluminum nitride (AlN), or any other suitable material. Die 1200 may also include a complementary metal oxide semiconductor (CMOS) device 1204. In embodiments, CMOS device 1204 may be formed on another buffer layer 1222. In embodiments, die 1200 may be a system-on-chip (SoC), and the transistor discussed above may be a part of a power management IC for the system-on-chip, or may be part of a radio frequency (RF) power amplifier of the SoC, such as that utilized in a mobile phone.

Figure 13:
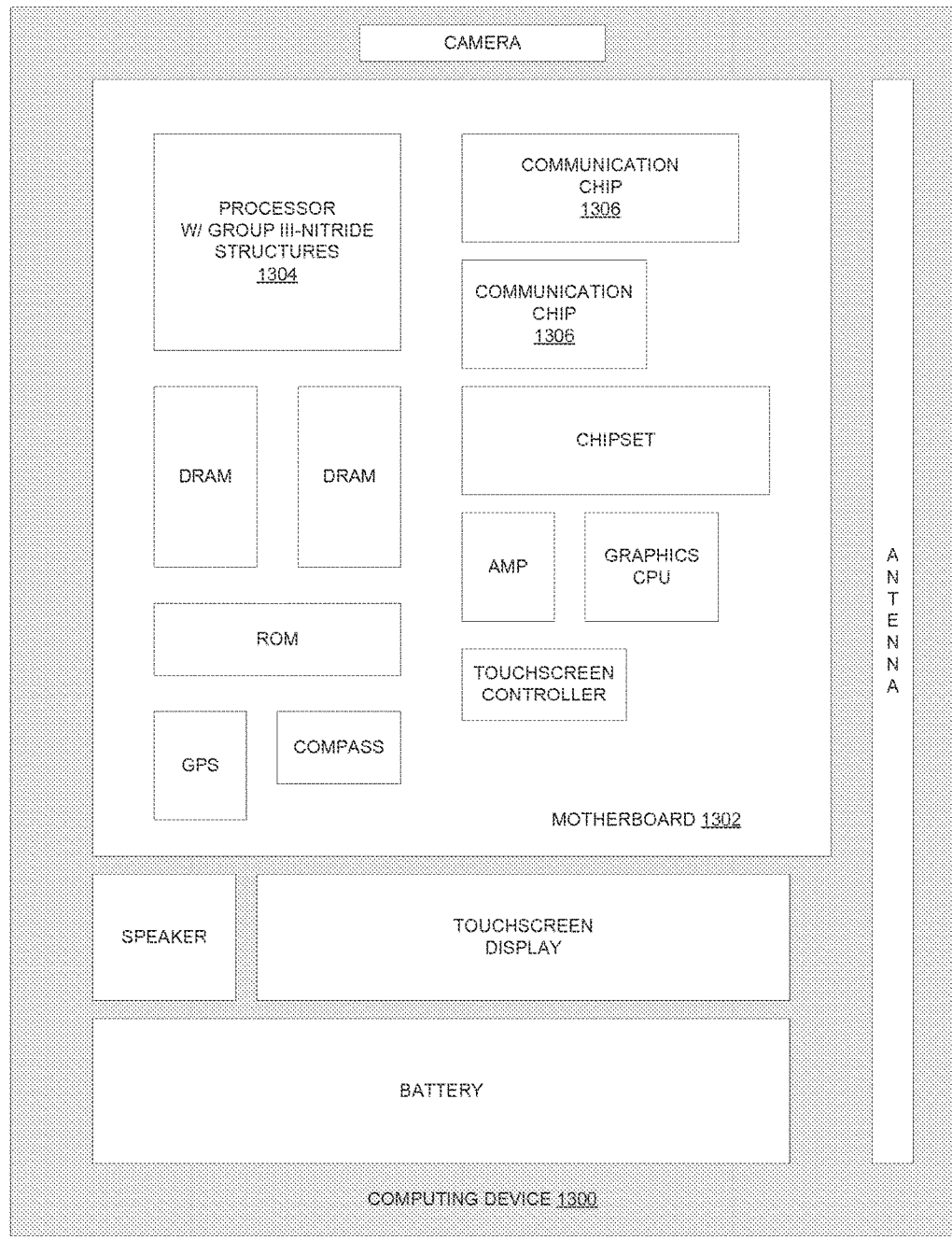
FIG. 13 schematically illustrates a computing device that includes an integrated circuit die, in accordance with various embodiments of the present disclosure.

Embodiments of the present disclosure may be implemented into a system using any suitable hardware and/or software to configure as desired. FIG. 13 schematically illustrates a computing device that includes an IC die as described herein, such as that depicted by FIGS. 1-10. The computing device 1300 may house a board such as motherboard 1302. The motherboard 1302 may include a number of components, including but not limited to a processor 1304 and at least one communication chip 1306. The processor 1304 may be physically and electrically coupled to the motherboard 1302. In some implementations, the at least one communication chip 1306 may also be physically and electrically coupled to the motherboard 1302. In further implementations, the communication chip 1306 may be part of the processor 1304.

Depending on its applications, computing device 1300 may include other components that may or may not be physically and electrically coupled to the motherboard 1302. These other components may include, but are not limited to, volatile memory (e.g., dynamic random access memory (DRAM)), non-volatile memory (e.g., read-only memory (ROM)), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth).

The communication chip 1306 may enable wireless communications for the transfer of data to and from the computing device 1300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1306 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible broadband wireless access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1306 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1306 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1306 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 1306 may operate in accordance with other wireless protocols in other embodiments.

The computing device 1300 may include a plurality of communication chips 1306. For instance, a first communication chip 1306 may be dedicated to shorter range wireless communications such as Wi-Fi and Bluetooth, and a second communication chip 1306 may be dedicated to longer range wireless communications such as GPS, EDGE, GPRS, CDMA, WiMAX, LTE, EV-DO, and others.

The processor 1304 of the computing device 1300 may be an IC die (e.g., IC die 106 of FIG. 1) incorporated into an IC assembly that may include a package substrate (e.g., package substrate 116 of FIG. 1). For example, the circuit board 124 of FIG. 1 may be a motherboard 1302 and the processor 1304 may be IC die 106. The processor 1304 and the motherboard 1302 may be coupled together using package-level interconnects as described herein. The term "processor" may refer to any device or portion of a device that processes electronic data from registers and/or memory to transform that electronic data into other electronic data that may be stored in registers and/or memory.

The communication chip 1306 may be an IC die (e.g., IC die 106) incorporated into an IC assembly that may include a package substrate (e.g., package substrate 116 of FIG. 1). In further implementations, another component (e.g., memory device or other integrated circuit device) housed within the computing device 1300 may be an IC die (e.g., IC die 106) incorporated into an IC assembly.

In various implementations, the computing device 1300 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1300 may be any other electronic device that processes data.

EXAMPLES

According to various embodiments, the present disclosure describes a number of examples. Example 1 may include an integrated circuit (IC) die comprising: a semiconductor substrate; a buffer layer disposed over the semiconductor substrate, the buffer layer having a plurality of openings formed therein; and a plurality of group III-Nitride structures, wherein individual group III-Nitride structures of the plurality of group III-Nitride structures include a lower portion disposed in a respective opening of the plurality of openings and an upper portion disposed over the respective opening, the upper portion including a base extending radially from sidewalls of the respective opening over a surface of the buffer layer to form a perimeter around the respective opening.

Example 2 may include the subject matter of Example 1, wherein a shape of an upper portion of at least one group III-Nitride structure of the plurality of group III-Nitride structures is one of a substantially pyramidal structure or a substantially frustum pyramidal structure, and wherein glide planes for defects in the at least one group III-Nitride structure extend vertically in the respective opening and terminate at respective faces of the at least one group III-Nitride structure.

Example 3 may include the subject matter of Example 2, wherein the glide planes are for threading dislocation defects extending vertically in the opening that are bent to intersect with each face of the at least one group III-Nitride structure along respective glide planes.

Example 4 may include the subject matter of Example 2, wherein a shape of an upper portion of at least one group III-Nitride structure of the plurality of group III-Nitride structures is substantially cuboidal, and wherein regions of the cuboidal structure disposed above the buffer layer have a reduced defect density in comparison to group III-Nitride material disposed above the opening.

Example 5 may include the subject matter of any one of Examples 1-4, further comprising a two-dimensional electron gas (2DEG) induction layer disposed over the plurality of group III-Nitride structures.

Example 6 may include the subject matter of Example 5, wherein the 2DEG induction layer comprises aluminum gallium nitride (AlGaN), aluminum indium nitride (AlInN), or aluminum indium gallium nitride (AlInGaN)

Example 7 may include the subject matter of any one of Examples 1-4, further comprising: a quantum well layer disposed over the plurality of group III-Nitride structures; a P-doped group III-Nitride layer disposed over the quantum well layer, wherein the lower portion of the individual group III-Nitride structures comprises n-doped group III-Nitride material.

Example 8 may include the subject matter of Example 7, wherein: the quantum well layer comprises gallium nitride (GaN), indium gallium nitride (InGaN), aluminum gallium nitride (AlGaN), or aluminum indium nitride (AlInN); the P-doped group III-Nitride layer comprises group III-Nitride material doped with magnesium (Mg); and the n-doped group III-Nitride material comprises semiconductor material doped with a selected one of silicon (Si), oxygen (O), or germanium (Ge).

Example 9 may include the subject matter of either of Examples 7 or 8, further comprising: a plurality of P-type contacts respectively disposed, on the P-doped group III-Nitride layer, over the individual group III-Nitride structures; and a plurality of N-type contacts disposed on the buffer layer between, and in direct contact with, adjacent ones of the individual group III-Nitride structures.

Example 10 may include the subject matter of any one of Examples 7-9, wherein the buffer layer is disposed on a first side of the semiconductor substrate and further comprising: a plurality of P-type contacts respectively disposed, on the P-doped group III-Nitride layer, over the individual group III-Nitride structures; and an N-type contact layer disposed on a second side of the semiconductor substrate, wherein the second side of the semiconductor substrate is opposite the first side of the semiconductor substrate, and wherein the semiconductor substrate is an n-doped semiconductor substrate.

Example 11 may include the subject matter of any one of Examples 7-10, further comprising a reflective layer disposed between the semiconductor substrate and the buffer layer, wherein the plurality of openings formed in the buffer layer extend into the reflective layer.

Example 12 may include the subject matter of any one of Examples 7-11, wherein the plurality of group III-Nitride structures are disposed on the IC die in a matrix configuration, the IC die further comprising one or more control circuits electrically coupled with the plurality of group III-Nitride structures to control the individual group III-Nitride structures.

Example 13 may include the subject matter of Example 12, wherein the IC die is a display.

Example 14 may include the subject matter of any one of Examples 1-13, wherein: the group III-Nitride structures comprise gallium nitride (GaN), indium gallium nitride (InGaN), aluminum gallium nitride (AlGaN), or aluminum indium nitride (AlInN); and the semiconductor substrate comprises silicon (Si).

Example 15 may include a method of forming an integrated circuit (IC) die assembly comprising: providing a semiconductor substrate; forming a buffer layer over the semiconductor substrate; forming a plurality of openings in the buffer layer; and forming a plurality of group III-Nitride structures, wherein forming individual group III-Nitride structures includes: forming a lower portion of the group III-Nitride structure in a respective opening of the plurality of openings; and forming an upper portion of the group III-Nitride structure over the respective opening, the upper portion having a base extending radially from sidewalls of the respective opening over a surface of the buffer layer to form a perimeter around the respective opening.

Example 16 may include the subject matter of Example 15, wherein forming an upper portion of the group III-Nitride structure includes forming a shape of the upper portion of the group III-Nitride structure, wherein the shape is one of a substantially pyramidal shape, a substantially frustum pyramidal shape, or a substantially cuboidal shape.

Example 17 may include the subject matter of either of Examples 15 or 16, further comprising: forming a two-dimensional electron gas (2DEG) induction layer over the plurality of group III-Nitride structures, and wherein the 2DEG induction layer comprises aluminum gallium nitride (AlGaN), aluminum indium nitride (AlInN), or aluminum indium gallium nitride (AlInGaN)

Example 18 may include the subject matter of Example 15, further comprising: forming a quantum well layer over the plurality of group III-Nitride structures; and forming a P-doped group III-Nitride layer over the quantum well layer, wherein the lower portion of the individual group III-Nitride structures comprises n-doped group III-Nitride material.

Example 19 may include the subject matter of Example 18, wherein: the quantum well layer comprises gallium nitride (GaN), indium gallium nitride (InGaN), aluminum gallium nitride (AlGaN), or aluminum indium nitride (AlInN); the P-doped group III-Nitride layer comprises group III-Nitride material doped with magnesium (Mg); and the n-doped group III-Nitride material comprises semiconductor material doped with a selected one of silicon (Si), oxygen (O), or germanium (Ge).

Example 20 may include the subject matter of either of Examples 18 or 19, further comprising: forming a plurality of P-type contacts on the P-doped group III-Nitride layer, over the individual group III-Nitride structures; and forming a plurality of N-type contacts on the buffer layer between, and in direct contact with, adjacent ones of the individual group III-Nitride structures.

Example 21 may include the subject matter of any one of Examples 18-20, wherein the buffer layer is disposed on a first side of the semiconductor substrate and further comprising: forming a plurality of P-type contacts on the P-doped group III-Nitride layer; and forming an N-type contact layer on a second side of the semiconductor substrate, wherein the second side of the semiconductor substrate is opposite the first side of the semiconductor substrate, and wherein the semiconductor substrate is an n-doped semiconductor substrate.

Example 22 may include the subject matter of any one of Examples 18-21, further comprising: forming a reflective layer on the semiconductor substrate prior to forming the buffer layer, wherein forming the plurality of openings includes forming openings in the reflective layer.

Example 23 may include the subject matter of any one of Examples 15-22, wherein: the plurality of group III-Nitride structures comprises gallium nitride (GaN), indium gallium nitride (InGaN), aluminum gallium nitride (AlGaN), or aluminum indium nitride (AlInN); and the semiconductor substrate comprises silicon (Si).

Example 24 may include an integrated circuit (IC) assembly comprising: one or more IC dies of any one of Examples 1-14; and a circuit board electrically and physically coupled with the one or more IC dies.

Example 25 may include the subject matter Example 24, wherein the IC assembly is part of a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

The invention claimed is:

1. An integrated circuit (IC) die comprising:
a semiconductor substrate;
a buffer layer disposed over the semiconductor substrate, the buffer layer having a plurality of openings formed therein; and
a plurality of group III-Nitride structures, wherein individual group III-Nitride structures of the plurality of group III-Nitride structures include a lower portion disposed in a respective opening of the plurality of openings and an upper portion disposed over the respective opening, the upper portion including a base extending radially from sidewalls of the respective opening over a surface of the buffer layer to form a perimeter around the respective opening; and
wherein a shape of an upper portion of at least one group III-Nitride structure of the plurality of group III-Nitride structures is one of a substantially pyramidal structure or a substantially frustum pyramidal structure or a substantially cuboidal structure and wherein glide planes for defects in the at least one group III-Nitride structure extend vertically in the respective opening and terminate at respective faces of the at least one group III-Nitride structure, wherein regions of the cuboidal structure disposed above the buffer layer have a reduced defect density in comparison to group III-Nitride material disposed above the opening.

2. The IC die of claim 1, wherein the glide planes are for threading dislocation defects extending vertically in the opening that are bent to intersect with each face of the at least one group III-Nitride structure along respective glide planes.

3. The IC die of claim 1, wherein the shape of the upper portion of the at least one group III-Nitride structure is the substantially pyramidal structure.

4. The IC die of claim 1, wherein the shape of the upper portion of the at least one group III-Nitride structure is the substantially frustum pyramidal structure.

5. The IC die of claim 1, further comprising a two-dimensional electron gas (2DEG) induction layer disposed over the plurality of group III-Nitride structures.

6. The IC die of claim 5, wherein the 2DEG induction layer comprises aluminum gallium nitride (AlGaN), aluminum indium nitride (AlInN), or aluminum indium gallium nitride (AlInGaN).

7. The IC die of claim 1, further comprising:
a quantum well layer disposed over the plurality of group III-Nitride structures;
a P-doped group III-Nitride layer disposed over the quantum well layer, wherein the lower portion of the individual group III-Nitride structures comprises n-doped group III-Nitride material.

8. The IC die of claim 7, wherein:
the quantum well layer comprises gallium nitride (GaN), indium gallium nitride (InGaN), aluminum gallium nitride (AlGaN), or aluminum indium nitride (AlInN);
the P-doped group III-Nitride layer comprises group III-Nitride material doped with magnesium (Mg); and
the n-doped group III-Nitride material comprises group III-Nitride material doped with a selected one of silicon (Si), oxygen (O), or germanium (Ge).

9. The IC die of claim 7, further comprising:
a plurality of P-type contacts respectively disposed, on the P-doped group III-Nitride layer, over the individual group III-Nitride structures; and
a plurality of N-type contacts disposed on the buffer layer between, and in direct contact with, adjacent ones of the individual group III-Nitride structures.

10. The IC die of claim 7, wherein the buffer layer is disposed on a first side of the semiconductor substrate and further comprising:
a plurality of P-type contacts respectively disposed, on the P-doped group III-Nitride layer, over the individual group III-Nitride structures; and
an N-type contact layer disposed on a second side of the semiconductor substrate, wherein the second side of the semiconductor substrate is opposite the first side of the semiconductor substrate, and wherein the semiconductor substrate is an n-doped semiconductor substrate.

11. The IC die of claim 7, further comprising a reflective layer disposed between the semiconductor substrate and the buffer layer, wherein the plurality of openings formed in the buffer layer extend into the reflective layer.

12. The IC die of claim 7, wherein the plurality of group III-Nitride are disposed on the IC die in a matrix configuration, the IC die further comprising one control circuits electrically coupled with the plurality of group III-Nitride structures to the individual group III-Nitride structures.

13. The IC die of claim 12, wherein the IC die is a display.

14. The IC die of claim 1, wherein:
the group III-Nitride structures comprise gallium nitride (GaN), indium gallium nitride (InGaN), aluminum gallium nitride (AlGaN), or aluminum indium nitride (AlInN); and
the semiconductor substrate comprises silicon (Si).

15. The IC die of claim 1, wherein the shape of the upper portion of the at least one group III-Nitride structure is the substantially cuboidal structure.

16. A method of forming an integrated circuit (IC) die assembly comprising:
providing a semiconductor substrate;
forming a buffer layer over the semiconductor substrate;
forming a plurality of openings in the buffer layer; and
forming a plurality of group III-Nitride structures, wherein forming individual group III-Nitride structures includes:
forming a lower portion of the group III-Nitride structure in a respective opening of the plurality of openings; and
forming an upper portion of the group III-Nitride structure over the respective opening, the upper portion having a base extending radially from sidewalls of the respective opening over a surface of the buffer layer to form a perimeter around the respective opening; and
wherein forming an upper portion of the group III-Nitride structure includes forming a shape of the upper portion of the group III-Nitride structure, wherein the shape is one of a substantially pyramidal shape, a substantially frustum pyramidal shape, or a substantially cuboidal shape, and wherein glide planes for defects in the at least one group III-Nitride structure extend vertically in the respective opening and terminate at respective faces of the at least one group III-Nitride structure, wherein regions of the cuboidal structure disposed above the buffer layer have a reduced defect density in comparison to group III-Nitride material disposed above the opening.

17. The method of claim 16 further comprising:
forming a two-dimensional electron gas (2DEG) induction layer over the plurality of group III-Nitride structures, and wherein the 2DEG induction layer comprises aluminum gallium nitride (AlGaN), aluminum indium nitride (AlInN), or aluminum indium gallium nitride (AlInGaN).

18. The method of claim 16, further comprising:
forming a quantum well layer over the plurality of group III-Nitride structures; and forming a P-doped group III-Nitride layer over the quantum well layer, wherein the lower portion of the individual group III-Nitride structures comprises n-doped group III-Nitride material.

19. The method of claim 18, wherein:
the quantum well layer comprises gallium nitride (GaN), indium gallium nitride (InGaN), aluminum gallium nitride (AlGaN), or aluminum indium nitride (AlInN);
the P-doped group III-Nitride layer comprises group III-Nitride material doped with magnesium (Mg); and
the n-doped group III-Nitride material comprises group III-Nitride material doped with a selected one of silicon (Si), oxygen (O), or germanium (Ge).

20. The method of claim 18, further comprising:
forming a plurality of P-type contacts on the P-doped group III-Nitride layer, over the individual group III-Nitride structures; and
forming a plurality of N-type contacts on the buffer layer between, and in direct contact with, adjacent ones of the individual group III-Nitride structures.

21. The method of either of claim 18, wherein the buffer layer is disposed on a first side of the semiconductor substrate and further comprising:
forming a plurality of P-type contacts on the P-doped group III-Nitride layer; and
forming an N-type contact layer on a second side of the semiconductor substrate, wherein the second side of the semiconductor substrate is opposite the first side of the semiconductor substrate, and wherein the semiconductor substrate is an n-doped semiconductor substrate.

22. The method of either of claim 18 further comprising:
forming a reflective layer on the semiconductor substrate prior to forming the buffer layer, wherein forming the plurality of openings includes forming openings in the reflective layer.

23. The method of claim 16, wherein:
the plurality of group III-Nitride structures comprises gallium nitride (GaN), indium gallium nitride (InGaN), aluminum gallium nitride (AlGaN), or aluminum indium nitride (AlInN); and
the semiconductor substrate comprises silicon (Si).

24. An integrated circuit (IC) assembly comprising: one or more IC dies including:
a semiconductor substrate;
a buffer layer disposed over the semiconductor substrate, the buffer layer having a plurality of openings formed therein; and
a plurality of group III-Nitride structures, wherein individual group III-Nitride structures of the plurality of group III-Nitride structures include a lower portion disposed in a respective opening of the plurality of openings and an upper portion disposed over the respective opening, the upper portion including a base extending radially from sidewalls of the respective opening over a surface of the buffer layer to form a perimeter around the respective opening;
a circuit board electrically and physically coupled with the one or more IC dies; and wherein a shape of an upper portion of at least one group III-Nitride structure of the plurality of group III-Nitride structures is one of a substantially pyramidal structure or a substantially frustum pyramidal structure or a substantially cuboidal structure, and wherein glide planes for defects in the at least one group III-Nitride structure extend vertically in the respective opening and terminate at respective faces of the at least one group III-Nitride structure, wherein regions of the cuboidal structure disposed above the buffer layer have a reduced defect density in comparison to group III-Nitride material disposed above the opening.

25. The IC assembly of claim 24, wherein the IC assembly is part of a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder.

* * * * *

UNITED STATES PATENT AND TRADEMARK OFFICE
CERTIFICATE OF CORRECTION

Page 1 of 1

PATENT NO. : 10,217,673 B2
APPLICATION NO. : 15/528031
DATED : February 26, 2019
INVENTOR(S) : Sansaptak Dasgupta et al.

It is certified that error appears in the above-identified patent and that said Letters Patent is hereby corrected as shown below:

In the Claims

Column 19
Lines 24-25, Claim 12 "...plurality of group III-Nitride are..." should read – "...plurality of group III-Nitride structures are..."
Lines 26-27, Claim 12 "...one control circuits electrically coupled..." should read – "...one or more control circuits electrically coupled..."

Column 20
Line 30, Claim 21 "The method of either of claim 18..." should read – "The method of claim 18..."
Line 40, Claim 22 "The method of either of claim 18..." should read – "The method of claim 18..."

Signed and Sealed this
Sixteenth Day of April, 2019

Andrei Iancu
*Director of the United States Patent and Trademark Office*